United States Patent
Lin et al.

(10) Patent No.: US 9,379,077 B2
(45) Date of Patent: Jun. 28, 2016

(54) METAL CONTACT FOR SEMICONDUCTOR DEVICE

(71) Applicant: NANTONG FUJITSU MICROELECTRONICS CO., LTD., Nantong, Jiangsu (CN)

(72) Inventors: Chang-Ming Lin, Jiangsu (CN); Lei Shi, Jiangsu (CN); Honghui Wang, Jiangsu (CN)

(73) Assignee: NANTONG FUJITSU MICROELECTRONICS CO., LTD., Nantong, Jiangsu (CN)

( * ) Notice: Subject to any disclaimer, the term of this patent is extended or adjusted under 35 U.S.C. 154(b) by 0 days.

(21) Appl. No.: 14/440,876

(22) PCT Filed: Oct. 30, 2013

(86) PCT No.: PCT/CN2013/086210
§ 371 (c)(1),
(2) Date: May 5, 2015

(87) PCT Pub. No.: WO2014/071813
PCT Pub. Date: May 15, 2014

(65) Prior Publication Data
US 2015/0303159 A1 Oct. 22, 2015

(30) Foreign Application Priority Data

Nov. 8, 2012 (CN) .......................... 2012 1 0444454
Nov. 8, 2012 (CN) .......................... 2012 1 0445562

(51) Int. Cl.
*H01L 23/00* (2006.01)

(52) U.S. Cl.
CPC ................ *H01L 24/14* (2013.01); *H01L 24/11* (2013.01); *H01L 24/13* (2013.01); *H01L 24/03* (2013.01);

(Continued)

(58) Field of Classification Search
CPC ...................... H01L 2224/73204; H01L 24/13; H01L 24/16; H01L 23/49816; H01L 24/81; H01L 23/3128
See application file for complete search history.

(56) References Cited

U.S. PATENT DOCUMENTS 6,518,651 B2  2/2003  Hashimoto
7,417,311 B2  8/2008  Yamano
(Continued)

FOREIGN PATENT DOCUMENTS

CN   1392607 A    1/2003
CN   1630029 A    6/2005
(Continued)

OTHER PUBLICATIONS

International Search Report in Chinese Language issued by the State Intellectual Property Office of the P.R. China, dated Jan. 6, 2014, for International Application No. PCT/CN2013/086210; 4 pages.

(Continued)

*Primary Examiner* — Ngan Ngo
(74) *Attorney, Agent, or Firm* — RatnerPrestia

(57) ABSTRACT

A semiconductor device package and packaging method, the semiconductor device packaging method comprising: providing a chip with a bonding pad formed on the chip surface; forming a passivation layer and a bump on the chip surface, wherein the passivation layer has an opening exposing part of the pad, the bump is located in the opening and the size of the bump is less than the size of the opening; forming a solder ball covering the top surface and the side wall of the bump, and the bottom surface of the opening. The formed semiconductor device package is not easy to form a short circuit. The bonding strength between the solder ball and the bump is high and the performance of the semiconductor device is stable.

16 Claims, 7 Drawing Sheets

(52) U.S. Cl.
CPC ............... *H01L 24/05* (2013.01); *H01L 24/78* (2013.01); *H01L 2224/0401* (2013.01); *H01L 2224/05624* (2013.01); *H01L 2224/05639* (2013.01); *H01L 2224/05644* (2013.01); *H01L 2224/05647* (2013.01); *H01L 2224/119* (2013.01); *H01L 2224/11013* (2013.01); *H01L 2224/1132* (2013.01); *H01L 2224/1134* (2013.01); *H01L 2224/1146* (2013.01); *H01L 2224/1147* (2013.01); *H01L 2224/1161* (2013.01); *H01L 2224/1182* (2013.01); *H01L 2224/1184* (2013.01); *H01L 2224/11825* (2013.01); *H01L 2224/11849* (2013.01); *H01L 2224/11902* (2013.01); *H01L 2224/11903* (2013.01); *H01L 2224/131* (2013.01); *H01L 2224/136* (2013.01); *H01L 2224/1308* (2013.01); *H01L 2224/13012* (2013.01); *H01L 2224/13013* (2013.01); *H01L 2224/13014* (2013.01); *H01L 2224/13016* (2013.01); *H01L 2224/13017* (2013.01); *H01L 2224/13018* (2013.01); *H01L 2224/1357* (2013.01); *H01L 2224/1358* (2013.01); *H01L 2224/13076* (2013.01); *H01L 2224/13082* (2013.01); *H01L 2224/13083* (2013.01); *H01L 2224/13111* (2013.01); *H01L 2224/13139* (2013.01); *H01L 2224/13144* (2013.01); *H01L 2224/13147* (2013.01); *H01L 2224/13541* (2013.01); *H01L 2224/13562* (2013.01); *H01L 2224/13582* (2013.01); *H01L 2224/13611* (2013.01); *H01L 2224/13639* (2013.01); *H01L 2224/13644* (2013.01); *H01L 2224/13655* (2013.01); *H01L 2224/78303* (2013.01); *H01L 2224/81191* (2013.01); *H01L 2924/014* (2013.01); *H01L 2924/0133* (2013.01); *H01L 2924/3841* (2013.01)

(56) References Cited

U.S. PATENT DOCUMENTS

| | | | |
|---|---|---|---|
| 7,713,860 B2 | 5/2010 | Yu | |
| 7,728,431 B2 | 6/2010 | Harada et al. | |
| 7,932,601 B2 | 4/2011 | Chang et al. | |
| 8,022,530 B2 | 9/2011 | Shih | |
| 8,492,263 B2 | 7/2013 | Wang et al. | |
| 8,492,891 B2 | 7/2013 | Lu et al. | |
| 9,018,758 B2 | 4/2015 | Hwang et al. | |
| 2002/0056741 A1 | 5/2002 | Shieh et al. | |
| 2002/0125569 A1 | 9/2002 | Fukuda et al. | |
| 2003/0234447 A1* | 12/2003 | Yunus | H01L 23/49816 257/739 |
| 2005/0167780 A1 | 8/2005 | Edelstein | |
| 2006/0237855 A1* | 10/2006 | Kroehnert | H01L 23/49816 257/779 |
| 2007/0048896 A1 | 3/2007 | Andry | |
| 2007/0085182 A1 | 4/2007 | Yamaguchi | |
| 2008/0048337 A1 | 2/2008 | Takahashi et al. | |
| 2008/0128904 A1 | 6/2008 | Sakamoto | |
| 2008/0191357 A1* | 8/2008 | Kouno | H01L 24/03 257/762 |
| 2008/0194095 A1 | 8/2008 | Daubenspeck | |
| 2008/0224308 A1 | 9/2008 | Lee | |
| 2009/0072393 A1 | 3/2009 | Bachman | |
| 2009/0098723 A1 | 4/2009 | Yu | |
| 2009/0110881 A1 | 4/2009 | Daubenspeck | |
| 2009/0200675 A1 | 8/2009 | Goebel | |
| 2009/0256257 A1* | 10/2009 | Daubenspeck | H01L 23/53295 257/738 |
| 2009/0309216 A1* | 12/2009 | Jeon | H01L 24/11 257/737 |
| 2010/0187690 A1 | 7/2010 | Okada et al. | |
| 2010/0230811 A1 | 9/2010 | Shin et al. | |
| 2010/0289092 A1 | 11/2010 | Perng | |
| 2011/0101527 A1 | 5/2011 | Cheng | |
| 2011/0115073 A1 | 5/2011 | Chen | |
| 2011/0133333 A1 | 6/2011 | Kwon | |
| 2011/0140126 A1 | 6/2011 | Gaul | |
| 2011/0266670 A1* | 11/2011 | England | H01L 23/562 257/738 |
| 2011/0310579 A1 | 12/2011 | Smeys | |
| 2012/0006591 A1 | 1/2012 | Kaneko | |
| 2012/0006592 A1* | 1/2012 | Ouchi | H01L 23/49816 174/267 |
| 2012/0086124 A1 | 4/2012 | Yamaguchi | |
| 2012/0261813 A1 | 10/2012 | Anderson | |
| 2013/0026618 A1 | 1/2013 | Chen | |
| 2013/0026622 A1 | 1/2013 | Chuang | |
| 2013/0049195 A1 | 2/2013 | Wu | |
| 2013/0113097 A1 | 5/2013 | Yu | |
| 2013/0119534 A1 | 5/2013 | Daubenspeck | |
| 2013/0207260 A1 | 8/2013 | Hsu | |
| 2013/0234315 A1* | 9/2013 | Daubenspeck | H01L 22/12 257/737 |
| 2013/0277829 A1 | 10/2013 | Yee | |
| 2013/0292817 A1 | 11/2013 | LaCroix | |
| 2014/0015122 A1 | 1/2014 | Chou | |
| 2014/0042633 A1 | 2/2014 | Hong | |
| 2014/0048926 A1 | 2/2014 | Wang | |
| 2014/0061924 A1 | 3/2014 | Chen | |
| 2014/0077374 A1 | 3/2014 | Lin | |
| 2014/0124897 A1 | 5/2014 | Motoyama | |
| 2014/0252608 A1 | 9/2014 | Chen | |
| 2015/0021759 A1 | 1/2015 | Chen | |
| 2015/0206837 A1 | 7/2015 | Gu | |
| 2015/0206846 A1 | 7/2015 | Lo | |
| 2015/0214127 A1 | 7/2015 | Gu | |
| 2015/0235940 A1 | 8/2015 | Chen | |

FOREIGN PATENT DOCUMENTS

| | | |
|---|---|---|
| CN | 101136383 A | 3/2008 |
| CN | 101154640 A | 4/2008 |
| CN | 101211791 A | 7/2008 |
| CN | 101315915 A | 12/2008 |
| CN | 101436559 A | 5/2009 |
| CN | 101728347 A | 6/2010 |
| CN | 102237316 A | 11/2011 |
| CN | 102270590 A | 12/2011 |
| CN | 102270610 A | 12/2011 |
| CN | 102437065 A | 5/2012 |
| CN | 102437066 A | 5/2012 |
| CN | 102496580 A | 6/2012 |
| CN | 102664174 A | 9/2012 |
| CN | 102915982 | 2/2013 |
| CN | 102915985 A | 2/2013 |
| CN | 102931098 A | 2/2013 |
| CN | 102931099 A | 2/2013 |
| CN | 102931101 A | 2/2013 |
| CN | 102931110 A | 2/2013 |
| CN | 102931158 A | 2/2013 |
| CN | 102931164 A | 2/2013 |
| CN | 202917475 U | 5/2013 |
| CN | 202917476 U | 5/2013 |
| CN | 202917483 U | 5/2013 |
| CN | 203013710 U | 6/2013 |
| JP | 2004247522 A | 9/2004 |
| JP | 2005136035 A | 5/2005 |
| JP | 2005286087 A | 10/2005 |
| JP | 2006229018 A | 8/2006 |
| JP | 2009224581 A | 10/2009 |
| JP | 201077456 A | 8/2010 |
| JP | 2012054297 A | 3/2012 |
| KR | 20110017153 A | 2/2011 |

OTHER PUBLICATIONS

International Search Report in English Language issued by the State Intellectual Property Office of the P.R. China, dated Jan. 6, 2014, for International Application No. PCT/CN2013/086210; 3 pages.

(56) References Cited

OTHER PUBLICATIONS

International Search Report and Written Opinion, in Chinese Language, issued by the State Intellectual Property Office of the P.R. China, dated Jan. 26, 2014, for International Application No. PCT/CN2013/086214; 11 pages.

International Search Report, in English Language, issued by the State Intellectual Property Office of the P.R. China, dated Jan. 26, 2014, for International Application No. PCT/CN2013/086214; 4 pages.

International Search Report and Written Opinion in Chinese Language, issued by the State Intellectual Property Office of the P.R. China, dated Jan. 8, 2014, for International Application No. PCT/CN2013/086211; 10 pages.

International Search Report in English Language, issued by the State Intellectual Property Office of the P.R. China, dated Jan. 8, 2014, for International Application No. PCT/CN2013/086211; 3 pages.

Non Final Office Action for U.S. Appl. No. 14/440,872 dated Dec. 3, 2015.

Notice of Allowance for U.S. Appl. No. 14/441,477 dated Dec. 18, 2015.

\* cited by examiner

| a chip with a plurality of pads formed thereon is provided, and a passivation layer is formed on a surface of the chip, wherein the passivation layer has a plurality of openings exposing a portion of surfaces of the pads | S201 |
|---|---|
| a plurality of bumps are formed on the surfaces of the pads in the openings, wherein the size of the bumps is less than the size of the openings | S202 |
| a plurality of solder balls are formed covering surfaces of the bumps and the surfaces of the pads exposed by the openings | S203 |

FIG. 4

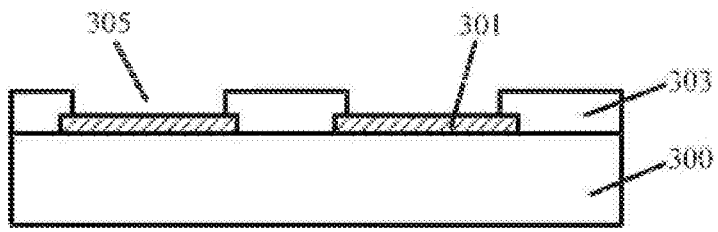

FIG. 5

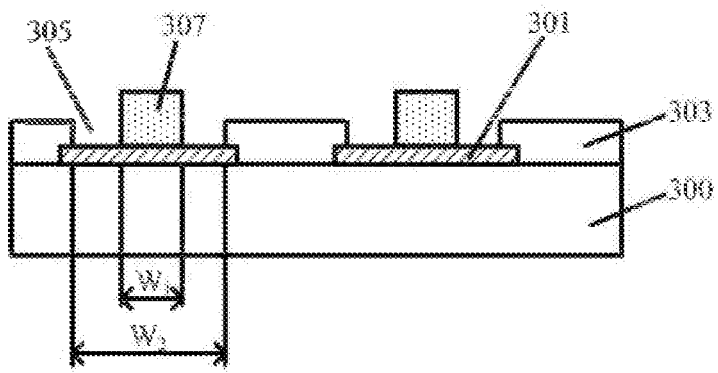

FIG. 6

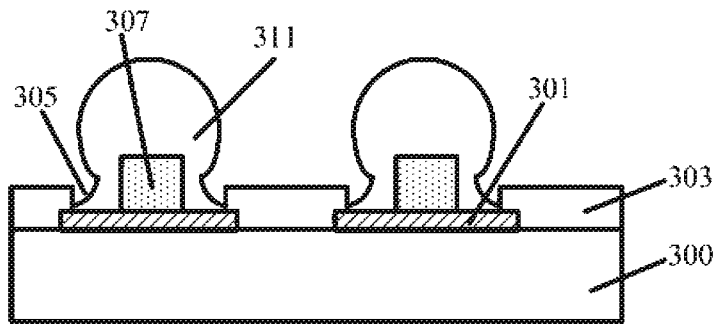

FIG. 7

| a chip with a plurality of pads formed thereon is provided, and a passivation layer is formed on a surface of the chip, wherein the passivation layer has a plurality of openings exposing a portion of surfaces of the pads | S401 |
|---|---|
| a plurality of bumps are formed on the surfaces of the pads in the openings, wherein the size of the bumps is less than the size of the openings | S402 |
| a plurality of anti-diffusion layers are formed covering surfaces of the bumps | S403 |
| a plurality of wetting layers are formed covering the plurality of anti-diffusion layers | S404 |
| a plurality of solder balls are formed covering the plurality of wetting layers and the surfaces of the pads exposed by the openings | S405 |

FIG. 8

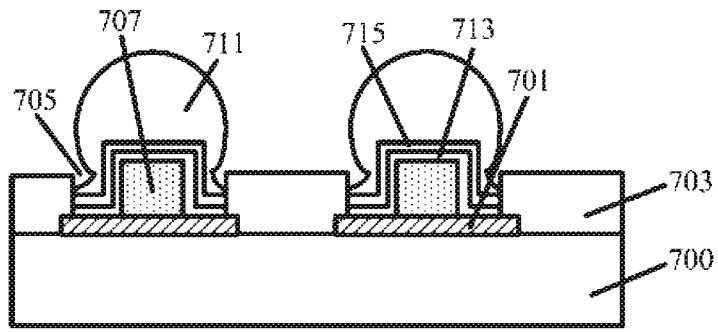

FIG. 16

| | |
|---|---|
| a chip with a plurality of pads formed thereon is provided, and a passivation layer is formed on a surface of the chip, wherein the passivation layer has a plurality of openings exposing a portion of surfaces of the pads | S801 |
| a plurality of bumps are formed on the surfaces of the pads in the openings, wherein the size of the bumps is less than the size of the openings, and each bump includes multiple overlapped sub bumps | S802 |
| a plurality of anti-diffusion layers are formed covering surfaces of the bumps, and the surfaces of the pads exposed by the openings | S803 |
| a plurality of wetting layers are formed covering the plurality of anti-diffusion layers | S804 |
| a plurality of solder balls are formed covering the plurality of wetting layers | S805 |

FIG. 17 ions No. PCT/CN2013/
METAL CONTACT FOR SEMICONDUCTOR DEVICE

CROSS-REFERENCE TO RELATED APPLICATIONS

The present application is a Section 371 National Stage Application of International Application No. PCT/CN2013/086210, filed on Oct. 30, 2013, which claims priority to Chinese patent application No. 201210445562.8, filed on Nov. 8, 2012, and entitled "PACKAGE STRUCTURE OF SEMICONDUCTOR DEVICE", and Chinese patent application No. 201210444454.9, filed on Nov. 8, 2012, and entitled "METHOD FOR PACKAGING SEMICONDUCTOR DEVICE", and the entire disclosures of which are incorporated herein by reference.

FIELD OF THE DISCLOSURE

The present disclosure generally relates to semiconductor manufacturing technology, and more particularly, to a package structure and a packaging method of a semiconductor device.

BACKGROUND OF THE DISCLOSURE

Packaging denotes to a process in which a device or a circuit is provided with a protecting shell. As semiconductor chips should be insulated from outside, the packaging process is necessary for the semiconductor chips, which can avoid circuit corrosion to the semiconductor chips caused by impurities in the air, so that electrical properties may not be affected. Besides, the packaged semiconductor chips may be prone to be installed and transported.

FIGS. 1 to 3 schematically illustrate a method for packaging a semiconductor device. The method includes following steps. Referring to FIG. 1, a chip 100 is provided, where a plurality of integrated circuits and a plurality of pads 101 for electrically connecting the integrated circuits are formed on a surface of the chip 100. Referring to FIG. 2, a passivation layer 103 is formed on the surface of the chip 100, the passivation layer 103 having a plurality of openings 105 exposing the pads 101. Referring to FIG. 3, forming a plurality of solder balls 107 on a surface of the pads 101 covering the openings 105.

However, conventional package structures of semiconductor devices have instable performance, which may result in a short circuit.

More information about a method for packaging a semiconductor device can be found in a Chinese patent publication No. CN101154640A.

SUMMARY

Embodiments of the present disclosure provide a package structure of a semiconductor device, the package structure having stable performance, so that a short circuit may not be formed easily.

In an embodiment, a method for packaging a semiconductor device is provided. The method includes: providing a chip with a pad formed thereon; forming a passivation layer and a bump successively on a surface of the chip, wherein the passivation layer has an opening exposing a portion of the pad, the bump is located in the opening and the size of the bumps is smaller than the size of the opening; and forming a solder ball covering a surface of the bump, and a surface of the pad exposed by the opening.

In some embodiments, the method may further include: forming an anti-diffusion layer covering the surface of the bump before the solder ball is formed.

In some embodiments, the anti-diffusion layer may further cover the surface of the pad exposed by the opening.

In some embodiments, the method may further include: forming a wetting layer covering the anti-diffusion layer.

In some embodiments, the wetting layer may be formed by a chemical plating process, and includes at least one of tin, gold and silver.

In some embodiments, the bump may be formed by a wire bonding process.

In some embodiments, the bump may include a plurality of overlapped sub bumps, and after one wire bonding process, the formed sub bumps may be planished.

In some embodiments, the bump may include a plurality of overlapped sub bumps, and the top sub bump among the plurality of overlapped sub bumps includes a main body and an end portion formed on a surface of the main body.

In some embodiments, the bump may include copper, gold, silver, copper alloy, gold alloy or silver alloy, and the solder ball may include tin or tin alloy.

In an embodiment, a package structure of a semiconductor device formed by the above-described method is provided. The package structure includes: a chip having a pad formed thereon; a passivation layer formed on a surface of the chip, wherein the passivation layer has an opening exposing a portion of the pad; a bump formed on a surface of the pad exposed by the opening, wherein the size of the bump is smaller than the size of the opening; and a solder ball covering a surface of the bump and the surface of the pad exposed by the opening.

In some embodiments, the package structure may further include an anti-diffusion layer covering a top surface and a sidewall of the bump, and the solder ball may be disposed on a surface of the anti-diffusion layer.

In some embodiments, the anti-diffusion layer may further cover the surface of the pad exposed by the opening.

In some embodiments, the anti-diffusion layer may include nickel.

In some embodiments, the package structure may further include a wetting layer covering the anti-diffusion layer, and the solder ball may be disposed on a surface of the wetting layer.

In some embodiments, the wetting layer may include at least one of tin, gold and silver.

In some embodiments, the bump may include a sub bump or a plurality of overlapped sub bumps.

In some embodiments, the bump may include a plurality of overlapped sub bumps, and the top sub bump among the plurality of overlapped sub bumps may include a main body and an end portion formed on a surface of the main body.

In some embodiments, the bump may include copper, gold, silver, copper alloy, gold alloy or silver alloy, and the solder ball may include tin or tin alloy.

Compared with existing techniques, the present disclosure may have following advantages. The solder ball is formed on the bump. Under the gravity, wetting force and surface tension, an interval between adjacent solder balls may be enlarged, such that it is not prone to form a short circuit in the package structure of the semiconductor device, which ensures stable performance of the semiconductor device. Besides, the bump has a size smaller than that of the opening. Thus, the solder ball formed in the subsequent process may not only cover the top surface of the bump but also cover the sidewall of the bump and the bottom of the opening. In this way, a lower portion of the solder ball has a hemline structure, which increases a contact area between the solder ball and the bump and further enhances the bonding strength therebetween. As a result, the performance and the yield of the package structure of the semiconductor device may be improved.

Further, the anti-diffusion layer is formed covering the top surface and the sidewall of the bump, and the bottom of the opening, which may avoid the generation of intermetallic compounds. And the wetting layer is formed covering the anti-diffusion layer, which may avoid the oxidation of the anti-diffusion layer and enhance the bonding strength between the solder ball and the anti-diffusion layer. In this way, the performance and the yield of the package structure of the semiconductor device may be further improved.

BRIEF DESCRIPTION OF THE DRAWINGS

FIG. 4 schematically illustrates a flow chart of a method for packaging a semiconductor device according to an embodiment of the present disclosure;

FIGS. 5 to 7 schematically illustrate cross-sectional views of intermediate structures of the method shown in FIG. 4;

FIG. 8 schematically illustrates a flow chart of a method for packaging a semiconductor device according to an embodiment of the present disclosure;

FIGS. 14 to 16 schematically illustrate cross-sectional views of intermediate structures of the method shown in FIG. 13;

FIG. 17 schematically illustrates a flow chart of a method for packaging a semiconductor device according to an embodiment of the present disclosure.

DETAILED DESCRIPTION OF THE DISCLOSURE

Figure 1:
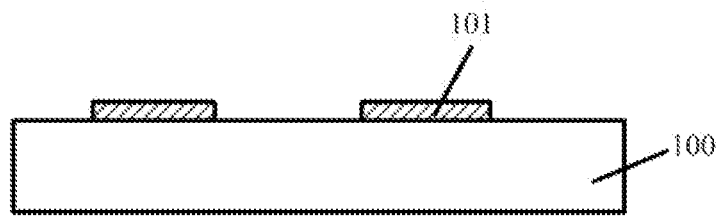
FIGS. 1 to 3 schematically illustrate cross-sectional views of intermediate structures of a process for packaging a semiconductor device in the existing techniques.
Figure 2:
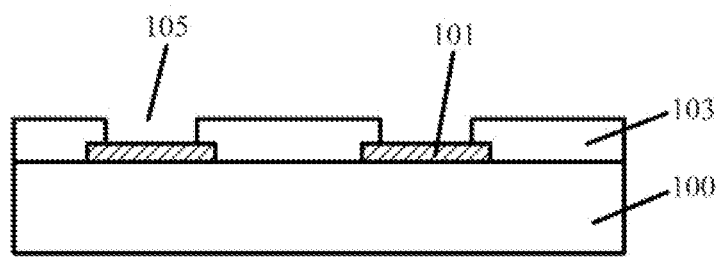

As described in the background, the performance of existing package structures of semiconductor devices is instable, which easily results in a short circuit in the package structures.

In the existing techniques, solder balls are directly formed on a surface of pads. Generally, the solder balls are hemispheric and have a relatively great diameter, and accordingly, the interval between the adjacent solder balls is relatively small, which easily results in a short circuit there and further reduces the stability of the performance of a package structure of a semiconductor device.

In embodiments of present disclosure, bumps are formed on pads, and solder balls are further formed on the bumps. Under the gravity, wetting force and surface tension, soldering tin of the solder balls may flow down along a sidewall of the bumps. Thus, the solder balls may change from a hemisphere to a sphere gradually. When the soldering tin having the same weight with the existing techniques is used, the formed solder balls may have a smaller diameter than that in the existing techniques, accordingly, the interval between the adjacent solder balls is increased. However, if the solder balls only cover the top surface of the bumps, the bonding strength between the solder balls and the bumps may be small, and the solder balls are prone to be kicked in a subsequent ball kicking experiment, which may reduce the yield of a package structure of a semiconductor device.

Further, the solder balls cover the top surface and the sidewall of the bumps, and a portion of the pads, thus, a contact area between the solder balls and the bumps is increased, the bonding strength therebetween is enhanced, and a contact area between the solder balls and the pads is increased, which may further improve the yield of the package structure of the semiconductor device.

In order to clarify the objects, characteristics and advantages of the disclosure, embodiments of present disclosure will be described in detail in conjunction with accompanying drawings.

Referring to FIG. 4, FIG. 4 schematically illustrates a flow chart of a method for packaging a semiconductor device. The method includes S201 to S203.

In S201, a chip with a plurality of pads formed thereon is provided, and a passivation layer is formed on a surface of the chip, wherein the passivation layer has a plurality of openings exposing a portion of surfaces of the pads.

In S202, a plurality of bumps are formed on the surfaces of the pads in the openings, wherein the size of the bumps is less than the size of the openings.

In S203, a plurality of solder balls are formed covering surfaces of the bumps and the surfaces of the pads exposed by the openings.

Referring to FIGS. 5 to 7, FIGS. 5 to 7 schematically illustrate cross-sectional views of intermediate structures of the method shown in FIG. 4.

Referring to FIG. 5, a chip 300 having a plurality of pads 301 formed thereon is provided, and a passivation layer 303 is formed on a surface of the chip 300, wherein the passivation layer 303 has a plurality of openings 305 exposing a portion of surfaces of the pads 301. In some embodiments, only one pad is formed on the chip.

The chip 300 is used as a working platform for subsequent packaging processes. In some embodiments, the chip 300 may further have integrated circuits electrically connected with the pads 301 formed thereon. The integrated circuits are formed to meet different requirements and transmit electric signals to external through the pads 301. In some embodiments, the integrated circuits and the pads 301 may be formed by etching a metal wiring layer deposited on the surface of the chip 300. In some embodiments, the integrated circuits and the pads 301 may be formed in one process. The pads 301 may include gold, silver, copper or other metals. Processes for forming the integrated circuits and the pads 301 are well known in the art and not described in detail here.

It should be noted that, in some embodiments, a solder ball made of tin or tin alloy may better infiltrate a pad made of gold, silver or copper. If the pads 301 include gold, silver or copper, the solder balls to be formed may easily cover the surfaces of the pads 301, which may enable stronger bonding between the solder balls and the pads 301.

In some embodiments, the passivation layer 303 may include silicon oxide or silicon nitride, and be adapted for insulating the integrated circuits and preventing the pads 301 from being defected or oxidized in subsequent processes. In some embodiments, the passivation layer 303 may be formed by a deposition process, such as a chemical vapor deposition process. Processes for forming the passivation layer 303 is well known in the art and not described in detail here.

The passivation layer 303 has the openings 305 therein which expose the surfaces of the pads 301 and are adapted for providing a process window for forming bumps on the surfaces of the pads 301. In some embodiments, the openings 305 may be formed by an etching process, such as an anisotropic dry etching process. In some embodiments, the pads 301 have a size greater than that of the openings 305.

Referring to FIG. 6, a plurality of bumps 307 are formed on the surfaces of the pads 301 in the openings 305, wherein the size of the bumps 307 is smaller than that of the openings 305.

Figure 3:
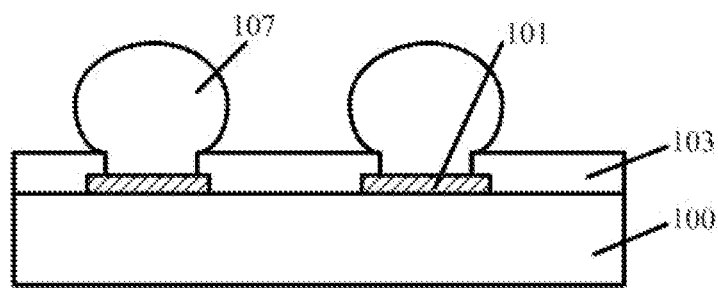

The inventors found that, in the existing techniques, the solder balls 107 are directly formed on surfaces of the pads 101 (as shown in FIG. 3). Generally, the solder balls 107 have a relatively great diameter, and accordingly, the interval between the adjacent solder balls 107 is relatively small, which easily results in a short circuit there and further reduces the stability of the semiconductor device.

Based on further study, the inventors found that, if the bumps 307 are formed on the surfaces of the pads 301 and the solder balls are further formed on the bumps, the formed solder balls may have a relatively small size, which may accordingly increase the interval between the adjacent solder balls.

In some embodiments, the plurality of bumps 307 may include a material having good thermal conductivity, such as copper, gold, silver, copper alloy, gold alloy or silver alloy. In subsequent processes, the bumps 307 may have solder balls with a relatively small diameter formed thereon. In some embodiments, the bumps 307 may include copper, which enables low cost, better conductivity, and the bumps 307 with better quality.

In some embodiments, the bumps 307 may be formed by a wiring bonding process, such as a hot pressing bonding process, a ultrasonic bonding process or a hot ultrasonic bonding process. As, the two kinds of metal atoms may diffuse into each other, such that a closer connection may be formed between the bumps 307 and the pads 301. In some embodiments, the bumps 307 may be formed by a hot ultrasonic bonding process, which may enhance the inter-diffusion at the original interface and the bonding strength. The diffusion of metal is performed on the whole interface, to realize high-quality welding of the bumps 307. As a result, the bumps 307 may be better fixed to the pads 301, and a forming process is simple. In some embodiments, to prevent copper wires for forming the bumps 307 from being oxidized in the wire bonding process, nitrogen with a volume percent of 95% and hydrogen with a volume percent of 5% are inlet in the wire bonding process.

In some embodiments, a chopper used in the wire bonding process may be wedge-shaped or spherical. In some embodiments, the bumps 307 may be columnar, thus, a spherical chopper is used to facilitate the formation of the bumps 307.

It should be noted that, in some embodiments, the bumps 307 may be formed by an electroplating process, or by a deposition process and an etching process, to form the bumps 307 which have a required size. The forming process is not described in detail here.

In some embodiments, the bumps 307 have a size W1 smaller than a size W2 of the openings 305, which facilitates to form the solder balls covering top surfaces and sidewalls of the bumps 307, and the surfaces of the pads 301 exposed by the openings 305. In this way, the bonding strength between the solder balls and the bumps 307 and between the solder balls and the pads 301 may be enhanced, and the intensity of the solder balls may be improved.

It should be noted that, a sectional view of the bumps 307 along the surface of the chip 300 may be circular, oval, square or triangular. The size W1 denotes to the length of the bump 307 in a direction parallel to the surface of the chip 300, and the size W2 denotes to the length of the opening 305 in the direction parallel to the surface of the chip 300.

Referring to FIG. 7, a plurality of solder balls 311 are formed covering surfaces of the bumps 307 and the surfaces of the pads 301 exposed by the openings 305.

In some embodiments, the solder balls 311 may include tin or tin alloy. The solder balls 311 may be formed by a bumping process and a reflow soldering process, or by a printing process and a reflow soldering process. As the size W1 of the bumps 307 is smaller than the size W2 of the openings 305, when the reflow soldering process is performed, molten tin shrinks to a spherical structure under surface tension and distributes on a surface of metal materials, that is, covering the surfaces of the pads 301 exposed by the openings 305. In this way, the solder balls 311 form a hemispherical shape in the bottom of the openings 305.

In some embodiments, the solder balls 311 may cover a surface of the bumps 307 (including the top surfaces and the sidewalls of the bumps 307), and the surfaces of the pads 301 exposed by the openings 305. A contact area between the solder balls 311 and the bumps 307, and a contact area between the solder balls 311 and the pads 301 are increased, thus, the tensile the solder balls 311 can suffer in vertical and horizontal directions may be increased, which enhances the intensity of the solder balls 311. Besides, the solder balls 311 have a relatively small diameter, which accordingly increases the interval between the adjacent solder balls 311 and further improves the reliability of the package structure of the semiconductor device.

In the embodiment shown in FIGS. 4 to 7, the bumps 307 are formed by the wire bonding process which is simple and enables the bumps 307 to be better bonded with the pads 301. Besides, the size W1 of the bumps 307 is smaller than the size W2 of the openings 305. During forming the solder balls 311, under the gravity and surface tension, the solder balls 311 cover the top surfaces and the sidewalls of the bumps 307, and the surfaces of the pads 301 exposed by the openings 305, a contact area between the solder balls 311 and the bumps 307, and a contact area between the solder balls 311 and the pads 301 are increased, which enhances the bonding strength between the solder balls 311 and the bumps 307, and between the solder balls 311 and the pads 301. Besides, the diameter of the solder balls 311 is relatively small, which accordingly increases the interval of the adjacent solder balls 311 and further enhances the stability of the package structure of the semiconductor device.

Accordingly, referring to FIG. 7, the package structure of the semiconductor device formed in the above embodiment is provided, including: the chip 300 having the plurality of pads 301 former thereon; the passivation layer 303 formed on the surface of the chip 300, wherein the passivation layer 303 has the plurality of openings 305 exposing a portion of the pads 301; the plurality of bumps 307 formed on the surface of the pads 301 exposed by the openings 305, wherein the size of the bumps 307 is smaller than the size of the openings 305; and the plurality of solder balls 311 covering the surfaces of the bumps 307 and the surfaces of the pads 301 exposed by the openings 305.

In some embodiments, the pads 301 have the same size with the openings 305. The pads 301 may include gold, silver or copper. In some embodiments, the bumps 307 may include a material having good thermal conductivity, such as copper, gold, silver, copper alloy, gold alloy or silver alloy. In some embodiments, the bumps 307 may include copper, which enables low cost and the bumps 307 with better quality. In some embodiments, the solder balls 311 may include tin or tin alloy, and the interval between the adjacent solder balls 311 is relatively small.

In the embodiment shown in FIGS. 4 to 7, the bumps 307 include copper, which enables low cost, better conductivity, and the bumps 307 with better quality. The solder balls 311 not only cover the top surfaces of the bumps 307, but also cover the sidewalls of the bumps 307 and the surfaces of the pads 301 exposed by the openings 305. The solder balls 311 have a relatively small diameter, which accordingly increases the interval between the adjacent solder balls 311. Besides, a contact area between the solder balls 311 and the bumps 307, and a contact area between the solder balls 311 and the pads 301 are increased, thus, the tensile the solder balls 311 can suffer in vertical and horizontal directions may be increased, such that the bonding strength between the solder balls 311 and the bumps 307, and between the solder balls 311 and the pads 301 are enhanced, and the solder balls 311 are prevented from being peeled off, which further improves the reliability of the package structure of the semiconductor device.

Different from the embodiment shown in FIGS. 4 to 7, in the below embodiment, anti-diffusion layers are further formed on top surfaces and sidewalls of bumps, such that copper atoms in the bumps and tin atoms in solder balls may not diffuse into each other, which prevents the bonding strength between the solder balls and the bumps from being reduced. Further, wetting layers may be formed covering surfaces of the anti-diffusion layers, which improves the bonding strength between the anti-diffusion layers and the solder balls.

Referring to FIG. 8, FIG. 8 schematically illustrates a flow chart of a method for packaging a semiconductor device according to an embodiment. The method includes S401 to S405.

In S401, a chip with a plurality of pads formed thereon is provided, and a passivation layer is formed on a surface of the chip, wherein the passivation layer has a plurality of openings exposing a portion of surfaces of the pads.

In S402, a plurality of bumps are formed on the surfaces of the pads in the openings, wherein the size of the bumps is less than the size of the openings.

In S403, a plurality of anti-diffusion layers are formed covering surfaces of the bumps.

In S404, a plurality of wetting layers are formed covering the plurality of anti-diffusion layers.

In S405, a plurality of solder balls are formed covering the plurality of wetting layers and the surfaces of the pads exposed by the openings.

Referring to FIGS. 9 to 12, FIGS. 9 to 12 schematically illustrate cross-sectional views of intermediate structures of the method shown in FIG. 8.

Figure 9:
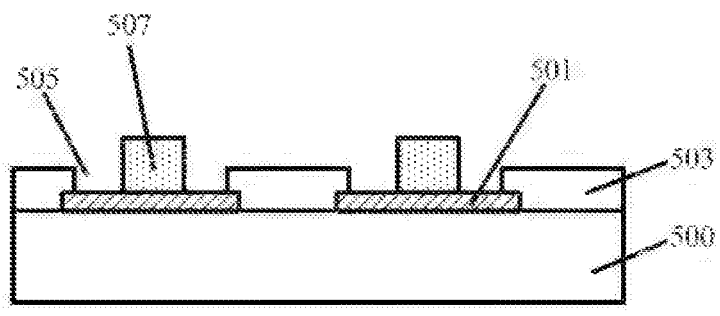
FIGS. 9 to 12 schematically illustrate cross-sectional views of intermediate structures of the method shown in FIG. 8.

Referring to FIG. 9, a chip 500 having a plurality of pads 501 formed thereon is provided, and a passivation layer 503 is formed on a surface of the chip 500, wherein the passivation layer 503 has a plurality of openings 505 exposing a portion of surfaces of the pads 501. A plurality of bumps 507 are formed on the surfaces of the pads 501 in the openings 505, wherein the size of the bumps 507 is smaller than that of the openings 505.

In some embodiments, the bumps 507 may include copper, which enables low cost, and better quality of the bumps 307.

Figure 10:
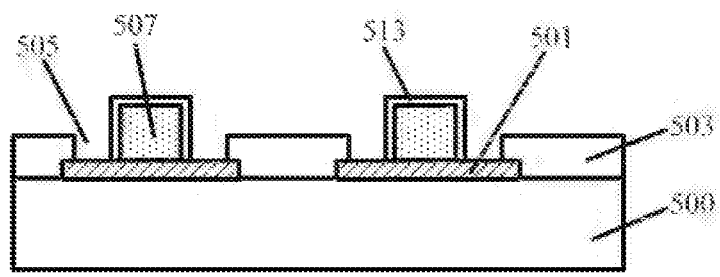

Referring to FIG. 10, a plurality of anti-diffusion layers 513 are formed covering top surfaces and sidewalls of the bumps 507.

The inventors found that, when the bumps 507 include copper and the solder balls include tin or tin alloy, if the solder balls are directly formed on the surfaces of the bumps 507, copper atoms in the bumps 507 and tin atoms in the solder balls may easily diffuse into each other, and intermetallic compounds of tin and copper and hollows may be generated. The intermetallic compounds of tin and copper are crisp, which may reduce the bonding strength between the solder balls and the bumps 507. Therefore, in some embodiments, the anti-diffusion layers 513 are formed covering the top surfaces and the sidewalls of the bumps 507, so as to prevent the copper atoms and the tin atoms from diffusing into each other.

In some embodiments, the anti-diffusion layers 513 may include nickel, to prevent the copper atoms in the bumps 507 and the tin atoms in the solder balls from diffusing into each other. In some embodiments, to effectively prevent the diffusion, the anti-diffusion layers 513 may have a thickness from 0.05 μm to 10 μm. In some embodiments, the anti-diffusion layers 513 may have a thickness from 0.5 μm to 5 μm. In some embodiments, the anti-diffusion layers 513 include nickel, and the thickness of the anti-diffusion layers 513 is from 1 μm to 3 μm, for example, 3 μm, which may effectively prevent the diffusion of the copper atoms and the tin atoms, and meet the requirement of high-level integration.

In some embodiments, the anti-diffusion layers 513 may be formed by following steps. An anti-diffusion film (not shown) is formed covering the passivation layer 503, the pads 501 and top surfaces and sidewalls of the bumps 507, a first mask layer (not shown) is formed covering a portion of the anti-diffusion film on the top surfaces and the sidewalls of the bumps 507, the anti-diffusion film is etched by taking the first mask layer as a mask, until the pads 501 and the passivation layer 503 are exposed, and the first mask layer is removed after the etching process.

It should be noted that, in some embodiments, the anti-diffusion layers 513 may be formed by other deposition and etching processes which can ensure that the formed anti-diffusion layers 513 cover the top surfaces and the sidewalls of the bumps 507. The deposition and etching processes are not described in detail here.

Figure 11:
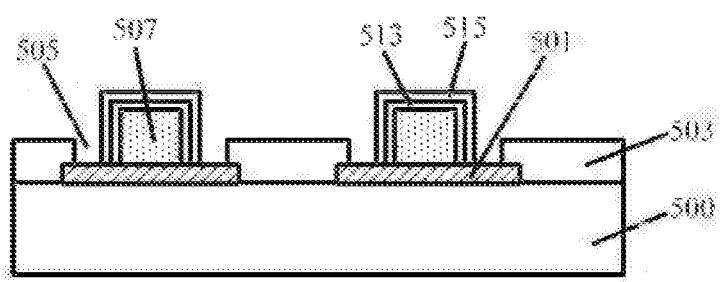

Referring to FIG. 11, a plurality of wetting layers 515 are formed covering the anti-diffusion layers 513.

The inventors found that, nickel in the anti-diffusion layers 513 is easily oxidized, and the bonding strength between the anti-diffusion layers 513 and the solder balls is relatively weak, thus, the intensity of the solder balls is relatively low and the solder balls may hardly pass a ball kicking detection. Therefore, the wetting layers 515, which can be well bonded with the anti-diffusion layers 513 and the solder balls, are formed as transition layers covering the anti-diffusion layer 513, which may enhance the bonding strength between the solder balls and the bumps 507. In some embodiments, a time interval between forming the anti-diffusion layers 513 and forming the wetting layers 515 may be less than three minutes, which may prevent the oxidation of the anti-diffusion layers 513 more effectively and further improve the performance of the package structure of the semiconductor device.

In some embodiments, the wetting layers 515 may at least include tin, gold or silver. The thickness of the wetting layers 515 may range from 0.05 μm to 3 μm, so as to enhance the bonding strength between the wetting layers 515 and the anti-diffusion layers 513, and between the wetting layers 515 and the solder balls. In some embodiments, the wetting layers 515 may include tin, and the thickness of the wetting layers 515 is 1 μm. In some embodiments, the wetting layers 515 and the solder balls to be formed may have the same material, such that they can be better bonded with each other.

In some embodiments, the wetting layers 515 may be formed by following steps. A seed film (not shown) is formed covering the anti-diffusion layers 513, the passivation layer 503 and pads 501, a second mask layer (not shown) is formed covering a portion of the seed film on the surfaces of the anti-diffusion layers 513, the seed film is etched by taking the second mask layer as a mask, until the pads 501 and the passivation layer 503 are exposed, and the second mask layer is removed after the etching process.

In some embodiments, the first mask layer and the second mask layer may be a same layer, and the anti-diffusion film and the seed film may be etched in one process, which may save procedures of process.

It should be noted that, in some embodiments, the wetting layers 515 may be formed by other deposition and etching processes which can ensure that the formed wetting layers 515 cover the anti-diffusion layers 513. The deposition and etching processes are not described in detail here.

It should be noted that, in some embodiments, the wetting layers 515 may not be formed, and the solder balls may be formed directly on the surfaces of the anti-diffusion layers 513 and the surfaces of the pads 501 exposed by the openings 505. The related forming processes are not described in detail here.

Figure 12:
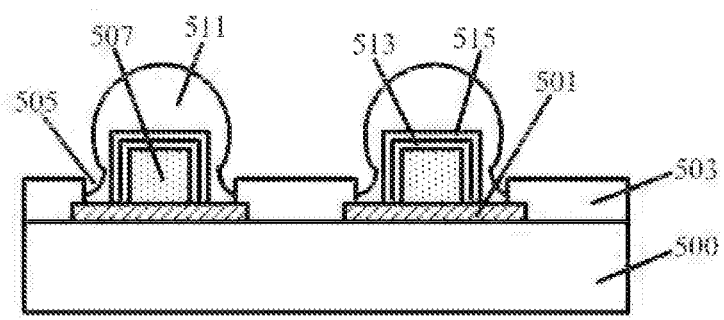

Referring to FIG. 12, a plurality of solder balls 511 are formed covering the plurality of wetting layers 515 and the surfaces of the pads 501 exposed by the openings 505.

In the embodiment shown in FIGS. 8 to 12, the solder balls 511 cover the surfaces of the bumps 507, and the surfaces of the pads 501. In this way, the lower portion of the solder balls 511 forms a hemline structure. A contact area between the solder balls 511 and the bumps 507, and a contact area between the solder balls 511 and the pads 501 are increased, thus, the bonding strength between the solder balls 511 and the pads 501 may be enhanced, which improves the intensity of the solder balls 511.

The process for forming the solder balls 511 may be similar with the embodiment shown in FIGS. 4 to 7, and is not described in detail here.

Based on above steps, the semiconductor device in the embodiment shown in FIGS. 8 to 12 is formed. Except for the advantages in the embodiment shown in FIGS. 4 to 7, the embodiment shown in FIGS. 8 to 12 may further have following advantages. As the anti-diffusion layers 513 and the wetting layers 515 are formed before forming the solder balls 511, tin in the solder balls 511 and copper in the bumps 507 may not diffuse into each other, which enhances the intensity of the solder balls 511 and further improves the stability of the package structure of the semiconductor device.

Accordingly, referring to FIG. 12, the package structure of the semiconductor device formed in the embodiment shown in FIGS. 8 to 12 is provided, including: the chip 500 having the plurality of pads 501 former thereon; the passivation layer 503 formed on the surface of the chip 500, wherein the passivation layer 503 has the plurality of openings 505 exposing a portion of the pads 501; the plurality of bumps 507 formed on the surface of the pads 501 exposed by the openings 505, wherein the size of the bumps 507 is smaller than the size of the openings 505; the plurality of anti-diffusion layers 513 covering the surfaces of the bumps 507; the plurality of wetting layers 515 covering the anti-diffusion layers 513; and the plurality of solder balls 511 covering the wetting layers 515 and the surfaces of the pads 501 exposed by the openings 505.

In some embodiments, the anti-diffusion layers 513 may include nickel, to prevent the copper atoms in the bumps 507 and the tin atoms in the solder balls 511 from diffusing into each other. In some embodiments, the anti-diffusion layers 513 may have a thickness from 0.05 µm to 10 µm, preferably, from 0.5 µm to 5 µm. In some embodiments, the anti-diffusion layers 513 include nickel, and the thickness of the anti-diffusion layers 513 is from 1 µm to 3 µm.

In some embodiments, to prevent the oxidation of the anti-diffusion layers 513, the wetting layers 515 may at least include tin, gold or silver, and to enhance the bonding strength between the anti-diffusion layers 513 and the wetting layers 515, and between the solder balls 511 and the wetting layers 515, the thickness of the wetting layers 515 may range from 0.05 µm to 3 µm. In some embodiments, the wetting layers 515 include tin, and the thickness of the wetting layers 515 is 1 µm.

More information about the package structure of the semiconductor device can be found in the embodiment shown in FIGS. 4 to 7 and in the above description of the method in the embodiment shown in FIGS. 8 to 12, and is not described in detail here.

Different from the embodiment shown in FIGS. 8 to 12, in the below embodiment, anti-diffusion layers may not only cover surfaces of bumps, but also cover surfaces of pads exposed by openings, to form a hemline structure, such that solder balls to be formed may cover the surfaces of the pads more easily and the intensity of the solder balls may be further improved.

Figure 13:
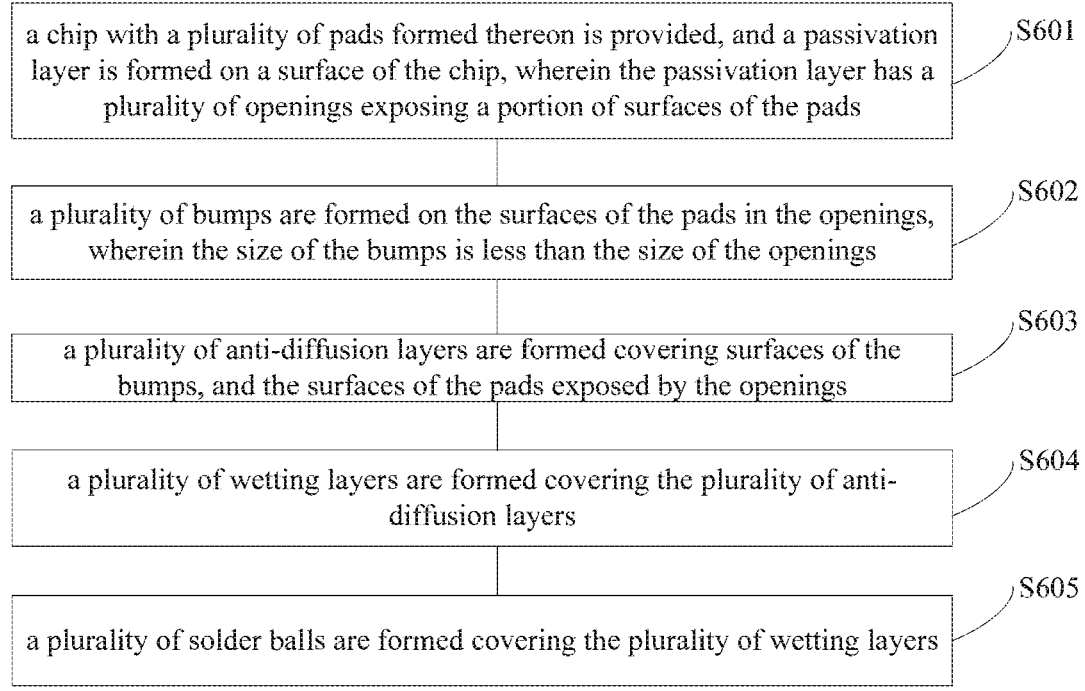
FIG. 13 schematically illustrates a flow chart of a method for packaging a semiconductor device according to an embodiment of the present disclosure.

Referring to FIG. 13, FIG. 13 schematically illustrates a flow chart of a method for packaging a semiconductor device according to an embodiment. The method includes S601 to S605.

In S601, a chip with a plurality of pads formed thereon is provided, and a passivation layer is formed on a surface of the chip, wherein the passivation layer has a plurality of openings exposing a portion of surfaces of the pads.

In S602, a plurality of bumps are formed on the surfaces of the pads in the openings, wherein the size of the bumps is less than the size of the openings.

In S603, a plurality of anti-diffusion layers are formed covering surfaces of the bumps, and the surfaces of the pads exposed by the openings.

In S604, a plurality of wetting layers are formed covering the plurality of anti-diffusion layers.

In S605, a plurality of solder balls are formed covering the plurality of wetting layers.

Figure 14:
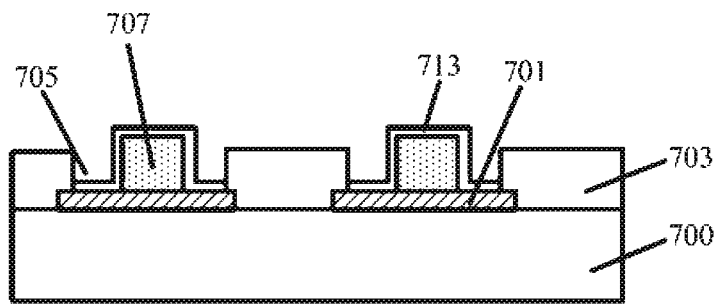
Figure 15:
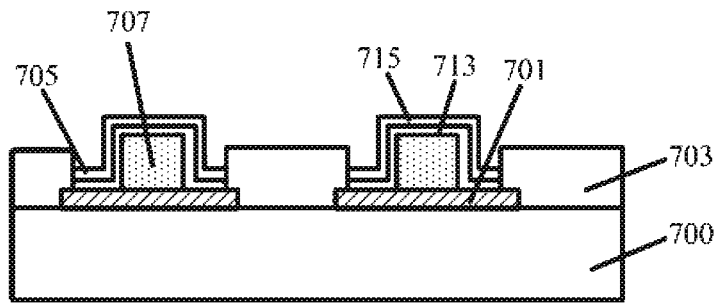

Referring to FIGS. 14 to 16, FIGS. 14 to 16 schematically illustrate cross-sectional views of intermediate structures of the method shown in FIG. 13.

Referring to FIG. 14, a chip 700 having a plurality of pads 701 formed thereon is provided, and a passivation layer 703 is formed on a surface of the chip 700, wherein the passivation layer 703 has a plurality of openings 705 exposing a portion of surfaces of the pads 701. A plurality of bumps 707 are formed on the surfaces of the pads 701 in the openings 705, wherein the size of the bumps 707 is smaller than that of the openings 705.

In some embodiments, the pads 701 may include aluminum, gold, silver or copper, which can be better infiltrated by nickel. In a subsequent process for forming anti-diffusion layers 713 of nickel alloy, the anti-diffusion layers 713 may be prone to cover the whole surfaces of the pads 701 exposed by the openings 705.

Still referring to FIG. 14, a plurality of anti-diffusion layers 713 are formed covering surfaces of the bumps 707, and the surfaces of the pads 701 exposed by the openings 705.

The inventors found that, tin atoms in solder balls to be formed and metal atoms in the pads 701 may diffuse into each other. Therefore, different from the embodiment shown in FIGS. 8 to 12, the anti-diffusion layers 713 not only cover top surfaces and sidewalls of the bumps 707, but also cover the surfaces of the pads 701 exposed by the openings 705, to prevent the tin atoms in the solder balls to be formed and the metal atoms in the pads 701 from diffusing into each other, thus, generation of intermetallic compounds may be avoided. In this way, the intensity of the solder balls may be improved.

In some embodiments, the anti-diffusion layers 713 may include nickel and be formed by a chemical plating process. In the chemical plating process, a nickel film covers both the surfaces of the bumps 707 and the surfaces of the pads 701. The process is simple, and a short circuit may not be formed, which ensures high stability of a package structure of a semiconductor device.

Referring to FIG. 15, a plurality of wetting layers 715 are formed covering the anti-diffusion layers 713.

In some embodiments, the wetting layers 715 may at least include tin, gold or silver, and the thickness of the wetting layers 715 may range from 0.05 µm to 3 µm, which may enhance the bonding strength between the anti-diffusion layers 713 and the wetting layers 715, and between the solder balls and the wetting layers 715. In some embodiments, the wetting layers 715 include tin, and the thickness of the wetting layers 715 is 1 µm.

In some embodiments, to simplify procedures of process and avoid a short circuit between the bumps 707, the wetting layers 715 may be formed using a same process with the anti-diffusion layers 713, such as a chemical plating process.

It should be noted that, in some embodiments, other functional layers may be formed on the surfaces of the anti-diffusion layers 713 before forming the wetting layers 715, which is not described in detail here.

Referring to FIG. 16, a plurality of solder balls 711 are formed covering the plurality of wetting layers 715.

As described above, the solder balls 711 cover the wetting layers 715 and the wetting layers 715 cover the surfaces (both the top surfaces and the sidewalls) of the bumps 707, thus, the solder balls 711 cover the surfaces of the bumps 707, and a lower portion of the solder balls 711 forms a hemline structure. Due to the wetting layers 715, the solder balls 711 may cover the surfaces of the pads 701 more easily. A contact area between the solder balls 711 and the wetting layers 715, and a contact area between the solder balls 711 and the pads 701 are increased, thus, the bonding strength between the solder balls 711 and the wetting layers 715, and between the solder balls 711 and the pads 701 may be enhanced, which improves the intensity of the solder balls 711.

A method and process for packaging the solder balls 711 can be found in the above description of the embodiment shown in FIGS. 8 to 12, and are not described in detail here.

Based on above steps, the semiconductor device in the embodiment shown in FIGS. 13 to 16 is formed. The anti-diffusion layers 713 covering the top surfaces and the sidewalls of the bumps 707, and the surfaces of the pads 701 is formed by a chemical plating process, such that a short circuit is not easily formed in the semiconductor device to be formed, the semiconductor device may have high stability, and a forming process is relatively simple. After forming the anti-diffusion layers 713, the wetting layers 715 are formed covering the anti-diffusion layers 713, and the solder balls 711 are formed covering the wetting layers 715. In this way, diffusion between the tin atoms in the solder balls 711 and the metal atoms in the pads 701 may be avoided, and the intensity of the solder balls 711 may be improved.

Accordingly, referring to FIG. 16, the package structure of the semiconductor device formed in the embodiment shown in FIGS. 13 to 16 is provided, including: the chip 700 having the plurality of pads 701 former thereon; the passivation layer 703 formed on the surface of the chip 700, wherein the passivation layer 703 has the plurality of openings 705 exposing a portion of the pads 701; the plurality of bumps 707 formed on the surface of the pads 701 exposed by the openings 705, wherein the size of the bumps 707 is smaller than the size of the openings 705; the plurality of anti-diffusion layers 713 covering the surfaces of the bumps 707, and the surfaces of the pads 701 exposed by the openings 705; the plurality of wetting layers 715 covering the anti-diffusion layers 713; and the plurality of solder balls 711 covering the wetting layers 715.

The anti-diffusion layers 713 not only cover the top surfaces and the sidewalls of the bumps 707, but also cover the surfaces of the pads 701 exposed by the openings 705, to prevent the diffusion between the tin atoms in the solder balls 711 and the copper atoms in the bumps 707, and between the tin atoms in the solder balls 711 and the metal atoms in the pads 701. In this way, the intensity of the solder balls 711 may be improved.

Further, the wetting layers 715 cover the surfaces of the anti-diffusion layers 713, that is, the wetting layers 715 cover the top surfaces and the sidewalls of the bumps 707, and the surfaces of the pads 701, which may effectively avoid the oxidation of the anti-diffusion layers 713 and improve the intensity of the solder balls 711.

Further, the solder balls 711 cover the surfaces of the wetting layers 715, that is, the solder balls 711 covers the top surfaces and the sidewalls of the bumps 707, and the surfaces of the pads 701. Under the gravity and the surface tension, the solder balls 711 have a spherical upper portion and a hemline lower portion. The solder balls 711 have relatively high intensity, and the package structure of the semiconductor device have high stability.

More details about the embodiment shown in FIGS. 13 to 16 can be found in the embodiment shown in FIGS. 4 to 7 and the embodiment shown in FIGS. 8 to 12, and are not described in detail here.

Expect for including the advantages of the above embodiments, the embodiment shown in FIGS. 13 to 16 may have following advantages. The anti-diffusion layers further cover the surfaces of the pads, which may effectively prevent diffusion between the tin atoms in the solder balls and the metal atoms in the pads, the bonding between the solder balls and the pads may be enhanced, and the intensity of the solder balls may be improved. Therefore, the performance of the semiconductor device may be more stable.

Different from the above embodiments, requirements on high-density products are taken into consideration in the below embodiment. Bumps are formed by performing bonding processes many times. And each bump includes multiple overlapped sub bumps. To make the bumps have a similar height and good coplanarity, the bumps are planished after each bonding process.

Referring to FIG. 17, FIG. 17 schematically illustrates a flow chart of a method for packaging a semiconductor device according to an embodiment. The method includes S801 to S805.

In S801, a chip with a plurality of pads formed thereon is provided, and a passivation layer is formed on a surface of the chip, wherein the passivation layer has a plurality of openings exposing a portion of surfaces of the pads.

In S802, a plurality of bumps are formed on the surfaces of the pads in the openings, wherein the size of the bumps is less than the size of the openings, and each bump includes multiple overlapped sub bumps.

In S803, a plurality of anti-diffusion layers are formed covering surfaces of the bumps, and the surfaces of the pads exposed by the openings.

In S804, a plurality of wetting layers are formed covering the plurality of anti-diffusion layers.

In S805, a plurality of solder balls are formed covering the plurality of wetting layers.

Figure 18:
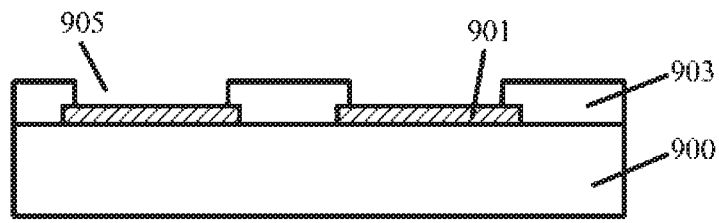
FIGS. 18 to 20 schematically illustrate cross-sectional views of intermediate structures of the method shown in FIG. 17.
Figure 19:
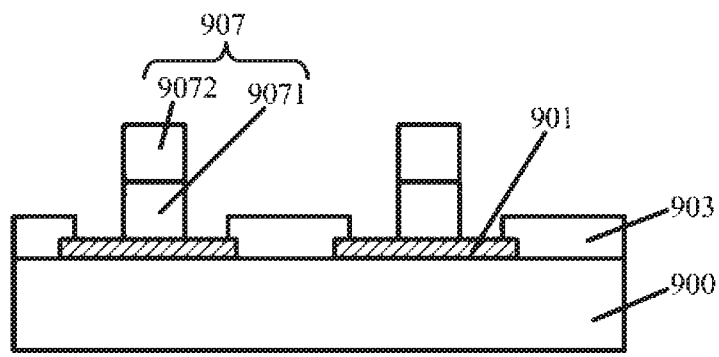
Figure 20:
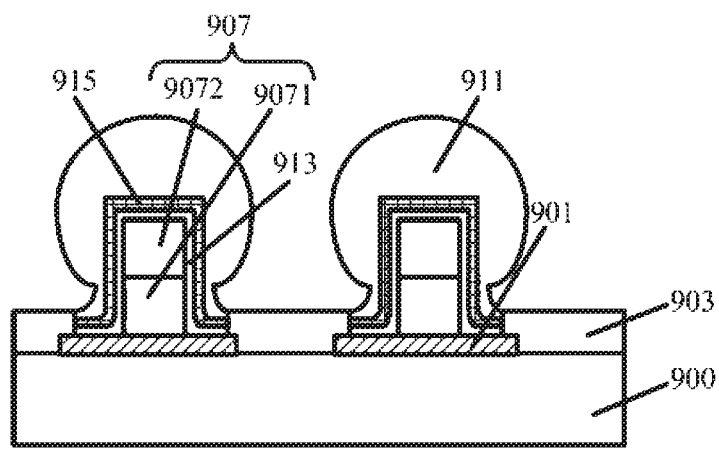

Referring to FIGS. 18 to 20, FIGS. 18 to 20 schematically illustrate cross-sectional views of intermediate structures of the method shown in FIG. 17.

Referring to FIG. 18, a chip 900 having a plurality of pads 901 and integrated circuits formed thereon is provided, and a passivation layer 903 is formed on a surface of the chip 900, wherein the passivation layer 903 has a plurality of openings 905 exposing a portion of surfaces of the pads 901.

The chip 300 is used as a working platform for subsequent processes. In some embodiments, the pads 901 and the integrated circuits may include aluminum, copper, gold or silver.

Referring to FIG. 19, a plurality of bumps 907 are formed on the surfaces of the pads 901 in the openings 905 (as shown in FIG. 18), wherein the size of the bumps 907 is smaller than that of the openings 905, and each bump 907 includes multiple sub bumps.

The inventors found that, each bump 907 may be a single-layer, or include multiple sub bumps, to meet practical requirements of different processes and product designs. For example, to meet the requirements of high-density products, a package structure of a semiconductor device to be formed should have bumps with a height of 6 µm. However, a sub bump formed by a wire bonding process has a height of 3 µm. Therefore, two wire bonding processes may be required.

In some embodiments, each bump 907 may include multiple sub bumps, such as two to five sub bumps. In some embodiments, the bumps 907 may be formed by a deposition process and an etching process, or by a wire bonding process.

In some embodiments, each bump 907 may include a first sub bump 9071 on the surface of the corresponding pad 901 and a second sub bump 9072 on a surface of the first sub bump 9071, to meet the requirements of different processes and product designs.

To simplify procedures of process, the first sub bump 9071 and the second sub bump 9072 may include a same material, for example, copper. The first sub bump 9071 and the second sub bump 9072 may be formed by a same process, for example, a wire bonding process. To make the bumps 907 have a similar height and good coplanarity, the bumps 907 may be planished after each bonding process.

In some embodiments, after each wire bonding process, the bumps 907 are planished. Specifically, after the first sub bumps 9071 are formed by the wire bonding process, the first sub bumps 9071 are planished to make them have a same height; then the wire bonding process is performed to form the second sub bumps 9072 on surfaces of the planished first sub bumps 9071; and then the second sub bumps 9072 are planished to make them have a same height. In this way, the bumps 907 may have good coplanarity, and the semiconductor device to be formed may have good performance.

It should be noted that, in some embodiments, the bumps 907 may be annealed, to make the overlapped sub bumps be better bonded with each other. The anneal process is not described in detail here. In some embodiments, each bump may include multiple overlapped sub bumps, and the top sub bump may include a main body and an end portion (not shown) on a surface of the main body. In some embodiments, the end portion may be formed in a wire bonding process, for example, a melted wire is pulled and an arc portion is formed. In some embodiments, the height of the end portion may be 0.005 to 1.5 times of the height of the main body. Therefore, a contact area between solder balls to be formed and each layer below the solder balls may be further increased, and the bonding strength between the solder balls and the each layer may be enhanced.

Referring to FIG. 20, a plurality of anti-diffusion layers 913 are formed covering surfaces of the bumps 907, and the surfaces of the pads 901 exposed by the openings 905, a plurality of wetting layers 915 are formed covering the anti-diffusion layers 913, and a plurality of solder balls 911 are formed covering the plurality of wetting layers 915.

In some embodiments, the anti-diffusion layers 913 may include nickel, to prevent copper atoms in the bumps 907 and tin atoms in the solder balls 911 from diffusing into each other. In some embodiments, the anti-diffusion layers 913 may have a thickness from 0.05 µm to 10 µm, preferably, from 0.5 µm to 5 µm. In some embodiments, the thickness of the anti-diffusion layers 913 is from 1 µm to 3 µm. In some embodiments, to prevent the oxidation of the anti-diffusion layers 913, the wetting layers 915 may at least include tin, gold or silver, and to enhance the bonding strength between the anti-diffusion layers 913 and the wetting layers 915, and between the solder balls 911 and the wetting layers 915, the thickness of the wetting layers 915 may range from 0.05 µm to 3 µm. In some embodiments, the wetting layers 915 include tin or tin alloy, and the solder balls 911 may have a spherical upper portion and a hemline lower portion.

More details about the embodiment shown in FIGS. 17 to 20 can be found in the embodiment shown in FIGS. 4 to 7, the embodiment shown in FIGS. 8 to 12, and the embodiment shown in FIGS. 13 to 16, and are not described in detail here.

Based on above steps, the package structure of the semiconductor device in the embodiment shown in FIGS. 17 to 20 is formed. The bumps include multiple overlapped sub bumps, which meets the requirements of different processes and product designs. Besides, during the wire bonding processes for forming the bumps, after sub bumps in one layer are formed, the sub bumps are planished, such that the bumps may be formed having the same height and good coplanarity, and further the package structure of the semiconductor device may have good performance.

Accordingly, referring to FIG. 20, the package structure of the semiconductor device formed in the embodiment shown in FIGS. 17 to 20 is provided, including: the chip 900 having the plurality of pads 701 former thereon; the passivation layer 903 formed on the surface of the chip 900, wherein the passivation layer 903 has the plurality of openings 905 exposing a portion of the pads 901; the plurality of bumps 907 formed on the surface of the pads 901 exposed by the openings 905, wherein the size of the bumps 907 is smaller than the size of the openings 905, and each bump 907 includes multiple overlapped sub bumps; the plurality of anti-diffusion layers 913 covering the surfaces of the bumps 907, and the surfaces of the pads 901 exposed by the openings 905; the plurality of wetting layers 915 covering the anti-diffusion layers 913; and the plurality of solder balls 911 covering the wetting layers 915.

The bumps 907 include a plurality of overlapped sub bumps, to meet the requirements of different processes and product designs. In some embodiments, each bump 907 may include the first sub bump 9071 on the surface of the corresponding pad 901 and the second sub bump 9072 on the surface of the first sub bump 9071. In some embodiments, to save cost, the first sub bump 9071 and the second sub bump 9072 may include a same material, for example, copper. It should be noted that, the first sub bump 9071 and the second sub bump 9072 may have a same size or different sizes.

The anti-diffusion layers 913 cover top surfaces and sidewalls of the second sub bumps 9072, sidewalls of the first sub bumps 9071, and the surfaces of the pads 901. The anti-diffusion layers 913 include nickel and have a thickness from 1 μm to 3 μm.

Further, the wetting layers 915 cover the surfaces of the anti-diffusion layers 913, that is, the wetting layers 915 cover the top surfaces and the sidewalls of the second sub bumps 9072, the sidewalls of the first sub bumps 9071, and the surfaces of the pads 901. The wetting layers 915 may at least include tin, gold or silver, and the thickness of the wetting layers 915 may range from 0.05 μm to 3 μm.

Further, the solder balls 911 cover the surfaces of the wetting layers 915, that is, the solder balls 911 covers the top surfaces and the sidewalls of the second sub bumps 9072, the sidewalls of the first sub bumps 9071, and the surfaces of the pads 901. Under the gravity, wetting force and surface tension, the solder balls 911 have a spherical upper portion and a hemline lower portion.

In some embodiments, each bump may include multiple overlapped sub bumps, and the top sub bump may include a main body and an end portion on a surface of the main body. Therefore, a contact area between the solder balls and the bumps may be increased, and further the intensity of the solder balls may be improved.

Expect for the advantages of the formed embodiments, the embodiment shown in FIGS. 17 to 20 may further have following advantages. The bumps include multiple sub bumps, which may meet the requirements of different processes and product designs.

From above, embodiments of the present disclosure may have following advantages. On one hand, the solder balls are formed on the bumps, accordingly, the interval between the adjacent solder balls may be increased. Thus, a short circuit may not be formed in the semiconductor device to be formed, and the semiconductor device may have good performance. On the other hand, the size of the bumps is smaller than the size of the openings, and thus the solder balls not only cover the top surfaces of the bumps, but also cover the sidewall of the bumps and the bottom of the openings. The lower portions of the solder balls have a hemline structure, which may increase the contact area between the solder balls and the bumps and further enhance the bonding strength therebetween. In this way, the intensity of the solder balls, and the performance and the yield of the package structure of the semiconductor device may be improved.

Further, the anti-diffusion layers are formed covering the top surfaces and sidewalls of the bumps, and the bottom of the openings, and the wetting layers are formed covering the anti-diffusion layers. The anti-diffusion layers may effectively prevent the generation of intermetallic compounds of tin and copper, and the wetting layers may effectively prevent the oxidation of the anti-diffusion layers, and improve the bonding strength between the solder balls and the anti-diffusion layers, which further improves the performance and the yield of the package structure of the semiconductor device.

Although the present disclosure has been disclosed as above with reference to preferred embodiments thereof but will not be limited thereto. Those skilled in the art can modify and vary the embodiments without departing from the spirit and scope of the present disclosure. Accordingly, without departing from the scope of the present invented technology scheme, whatever simple modification and equivalent variation belong to the protection range of the present invented technology scheme.

What is claimed is:

1. A method for packaging a semiconductor device, comprising:
   providing a chip with a pad formed thereon;
   forming a passivation layer and a bump on a surface of the chip successively, wherein the passivation layer has an opening exposing a portion of the pad, the bump is located in the opening and the size of the bump is smaller than the size of the opening; and
   forming a solder ball covering a surface of the bump, and a surface of the pad exposed by the opening,
   wherein the bump is formed by a wire bonding process and comprises a plurality of overlapped sub bumps, and after the wire bonding process, the formed sub bumps are planished.

2. The method according to claim 1, wherein the bump comprises a plurality of overlapped sub bumps, and the top sub bump among the plurality of overlapped sub bumps comprises a main body and an end portion formed on a surface of the main body.

3. The method according to claim 1, wherein the bump comprises copper, gold, silver, copper alloy, gold alloy or silver alloy, and the solder ball comprises tin or tin alloy.

4. The semiconductor device formed by the method according to claim 1, comprising:
   the chip having the pad formed thereon;
   the passivation layer formed on the surface of the chip, wherein the passivation layer has the opening exposing the portion of the pad;
   the bump formed on the surface of the pad exposed by the opening, wherein the size of the bump is smaller than the size of the opening; and
   the solder ball covering the surface of the bump and the surface of the pad exposed by the opening,
   wherein the bump comprises a plurality of overlapped sub bumps, and the top sub bump among the plurality of overlapped sub bumps comprises a main body and an end portion formed on a surface of the main body.

5. The semiconductor device according to claim 4, further comprising an anti-diffusion layer covering a top surface and a sidewall of the bump, wherein the solder ball is disposed on a surface of the anti-diffusion layer.

6. The semiconductor device according to claim 5, wherein the anti-diffusion layer further covers the surface of the pad exposed by the opening.

7. The semiconductor device according to claim 5, wherein the anti-diffusion layer comprises nickel.

8. The semiconductor device according to claim 5, further comprising a wetting layer covering the anti-diffusion layer, wherein the solder ball is disposed on a surface of the wetting layer.

9. The semiconductor device according to claim 8, wherein the wetting layer comprises at least one of tin, gold and silver.

10. The semiconductor device according to claim 4, wherein the bump comprises copper, gold, silver, copper alloy, gold alloy or silver alloy, and the solder ball comprises tin or tin alloy.

11. The semiconductor device according to claim 5, further comprising a wetting layer covering the anti-diffusion layer, wherein the solder ball is disposed on a surface of the wetting layer.

12. The method according to claim 1, further comprising: forming an anti-diffusion layer covering the surface of the bump before the solder ball is formed.

13. The method according to claim 12, wherein the anti-diffusion layer further covers the surface of the pad exposed by the opening.

14. The method according to claim 12, further comprising: forming a wetting layer covering the anti-diffusion layer.

15. The method according to claim 14, wherein the wetting layer is formed by a chemical plating process, and comprises at least one of tin, gold and silver.

16. The method according to claim 13, further comprising: forming a wetting layer covering the anti-diffusion layer.

\* \* \* \* \*